United States Patent [19]

Yoshida et al.

[11] 4,351,674

[45] Sep. 28, 1982

[54] METHOD OF PRODUCING A SEMICONDUCTOR DEVICE

[75] Inventors: Isao Yoshida, Tokyo, Japan; Yasuo Wada, Waban, Mass.; Masao Tamura, Tokorozawa, Japan; Masanobu Miyao, Kodaira, Japan; Makoto Ohkura, Hachioji, Japan; Nobuyoshi Natsuaki, Kodaira, Japan; Takashi Tokuyama, Higashikurume, Japan

[73] Assignee: Hitachi, Ltd., Tokyo, Japan

[21] Appl. No.: 182,825

[22] Filed: Aug. 29, 1980

[30] Foreign Application Priority Data

Aug. 29, 1979 [JP] Japan .................................. 54-109165

[51] Int. Cl.³ .................. H01L 21/265; H01L 21/263
[52] U.S. Cl. ...................................... 148/1.5; 29/571; 29/576 B
[58] Field of Search ................ 29/571, 576 B; 148/1.5

[56] References Cited

U.S. PATENT DOCUMENTS

| | | | |
|---|---|---|---|
| 4,172,741 | 10/1979 | Johnson | 148/1.5 |
| 4,179,310 | 12/1979 | Compton et al. | 148/1.5 |
| 4,212,900 | 7/1980 | Serlin | 427/531 |
| 4,229,232 | 10/1980 | Kirkpatrick | 148/1.5 |
| 4,229,502 | 10/1980 | Wu et al. | 428/446 |
| 4,230,505 | 10/1980 | Wu et al. | 148/1.5 |
| 4,243,433 | 1/1981 | Gibbons | 148/1.5 |
| 4,249,960 | 2/1981 | Schnable et al. | 148/1.5 |
| 4,267,011 | 5/1981 | Shibata | 29/571 |
| 4,268,950 | 5/1981 | Chatterjee et al. | 29/571 |
| 4,278,475 | 7/1981 | Bartko et al. | 148/1.5 |

OTHER PUBLICATIONS

Joshi et al., IBM Technical Disclosure Bulletin, vol. 11, Jul. 1968, No. 2, pp. 104–105.
Hutchins et al., IBM Technical Disclosure Bulletin, vol. 16, Jan. 1974, No. 8, pp. 2586–2587.
Baeri et al., Appl. Phys. Lett. 33(2) Jul. 1978, pp. 137–140.
White et al., Appl. Phys. Lett. 33(7) Oct. 1978, pp. 662–664.
Affolter et al., Appl. Phys. Lett. 33(2) Jul. 1978, pp. 185–187.

*Primary Examiner*—Arthur P. Demers
*Attorney, Agent, or Firm*—Antonelli, Terry & Wands

[57] ABSTRACT

A region containing a high concentration of impurity and a desired region adjacent thereto are fused by irradiation with a laser beam, to diffuse the impurity in the lateral direction into the desired region and to render the desired region a low resistance.

Since this method can execute only the lateral diffusion of the impurity without affecting other portions, it is very useful for forming a high breakdown voltage MISFET, a resistor etc.

11 Claims, 5 Drawing Figures

METHOD OF PRODUCING A SEMICONDUCTOR DEVICE

BACKGROUND OF THE INVENTION

1. Field of the Invention

This invention relates to a method of producing a semiconductor device. More particularly, it relates to a method of producing a semiconductor device in which an impurity at a high concentration contained locally within a polycrystalline silicon film or the like is diffused in a lateral direction (a plane direction) by irradiation with a laser beam, whereby a MIS-FET (metal-insulator-semiconductor field effect transistor) of high breakdown voltage, a resistor, etc. can be formed at a high precision.

2. Description of the Prior Art

As is well known, a MIS-FET is such that a gate electrode is disposed on a semiconductor substrate through an insulating film which is made of, for example, silicon dioxide or silicon nitride and that a channel current to flow across a source and a drain is controlled by applying a voltage to the gate electrode.

In order to enhance the source-drain breakdown voltage of such MIS-FET, there has been proposed a MIS-FET called the offset gate type.

FIG. 1 is a view showing an example of the sectional structure of the offset gate type MIS-FET. This MIS-FET is the same as a conventional n-channel MIS-FET in that a source 2 and a drain 3 having a high n-type impurity concentration are disposed in surface regions of a p-type silicon substrate 1 and that a gate electrode 5 is disposed on the substrate 1 through an insulating film 4. An offset exists between the gate 5 and the drain 3, and an n-type low impurity concentration region 6 for moderating the electric field intensity betwen the gate 5 and the drain 3 so as to enhance the breakdown voltage between the source 2 and the drain 3 is formed.

For the gate electrode of the MIS-FET, a conductive metal such as aluminum was generally employed at first. At present, however, a polycrystalline silicon film has been often employed in order to raise the density of integration by self-alignment.

The offset gate type MIS-FET which employs the polycrystalline silicon film as the gate electrode is formed as follows.

As shown in FIG. 2, an insulating film 4 and a gate 5 are formed on a silicon substrate 1. Thereafter, using the gate 5 as a mask, ions of an n-type impurity are implanted to form an n-type low concentration region 6. Further, using a mask 7 made of an SiO$_2$ film or the like, a large quantity of n-type impurity is implanted by the ion implantation, to form a source 2 and a drain 3.

As apparent from FIG. 1, in the offset gate type MIS-FET, the left end and right end of the gate 5 must be in perfect alignment with the right end of the source 2 and the left end of the low concentration region 6 respectively. When it is intended to realize such structure by the prior-art method described above, a part of the gate 5 becomes a high resistance, which has led to the problem that the switching characteristics of the MIS-FET degrade conspicuously.

More specifically, the mask 7 is formed by the well-known photoetching. The photoetching inevitably involves some degree of error of registration. It is therefore impossible to perfectly align the right end of the gate 5 with the left end of the mask 7.

If a gap appears between the right end of the gate 5 and the left end of the mask 7, a large quantity of impurity is implanted also underneath the gap by the ion implantation at a high concentration to be subsequently carried out, and the formation of the offset gate type MIS-FET becomes impossible.

In order to prevent the formation of such gap, the mask 7 for the ion implantation is formed so that the gate 5 and the mask 7 may overlap each other as illustrated in FIG. 2.

Thus, it is tentatively possible to form the offset gate type MIS-FET. However, no ion is implanted into the region of the gate 5 covered with the mask, and the ions are implanted into only the exposed region.

In consequence, the whole gate 5 does not become a low resistance, but a low resistance region 8 of high impurity concentration and a high resistance region 9 of low impurity concentration are formed.

When the high resistance region 9 exists in the gate electrode 5, the switching characteristics of the MIS-FET are limited by the resistance of this portion and worsen conspicuously.

In order to solve such problem, the impurity contained in the high concentration region 8 may be diffused in the lateral direction so as to distribute the impurity uniformly in the whole gate 5, or alternatively, a large quantity of impurity may be contained in advance within the polycrystalline silicon making up the gate electrode 5.

Heretofore, however, for the lateral diffusion of the impurity there has not been any other method than heating the entire silicon substrate to a high temperature, and it has been extremely difficult to laterally diffuse the impurity without degrading other characteristics. The measure in which a large quantity of impurity is contained within the polycrystalline silicon in advance has incurred the problems of a remarkable increase in the number of required process steps and a low workability of the polycrystalline silicon of high impurity concentration. Both the measures have been difficult to be put into practical use.

For the sake of convenience, the case of the offset gate type MIS-FET has been exemplified. It is obvious, however, that if an impurity can be diffused in the lateral direction without exerting any influence on others, this is very useful for the production of various semiconductor devices including, not only the offset type MIS-FET, but also diodes, resistors etc.

Nevertheless, it has not hitherto been carried out at all that an impurity of high concentration existing locally is diffused in the lateral direction so as to form a uniform layer of low resistance.

SUMMARY OF THE INVENTION

An object of this invention is to provide a method of producing a semiconductor device which can laterally diffuse a locally existant impurity without exerting any influence on others.

Another object of this invention is to provide a method of producing a semiconductor device in which an impurity is laterally diffused, whereby a MIS-FET of high breakdown voltage exhibiting excellent switching characteristics, a resistor, an interconnection etc. can be formed at a high precision.

In order to accomplish the objects, this invention consists in that a region in which an impurity of high concentration exists and a desired region which adjoins the first-mentioned region are irradiated with a laser beam so as to be selectively heated, whereby the impurity is diffused into the desired region to be uniformly distributed.

DETAILED DESCRIPTION OF THE PREFERRED EMBODIMENTS

This invention will be described in detail in conjunction with embodiments.

Embodiment 1

Figure 1:
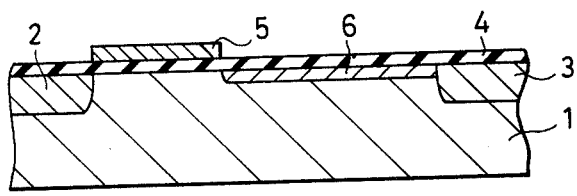
FIG. 1 is a view showing the sectional structure of a high breakdown voltage MIS-FET.
Figure 2:
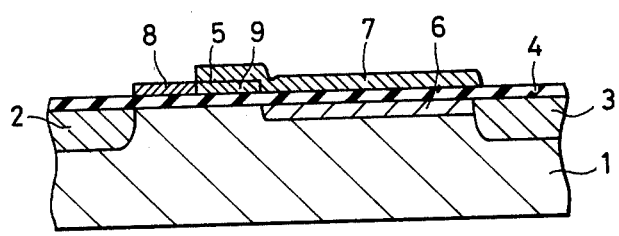
FIG. 2 is a view for explaining a prior-art method of producing the high breakdown voltage MIS-FET.

First, a MIS-FET of the structure shown in FIG. 2 was formed in accordance with the prior-art method.

As illustrated in FIG. 2, on a p-type silicon substrate 1, a silicon dioxide film 4 being 0.13 $\mu$m thick was deposited by the well-known thermal oxidation, and a polycrystalline silicon film being 0.4 $\mu$m thick was further deposited. Thereafter, the polycrystalline silicon film has its unnecessary parts removed by the well-known photoetching so as to form a gate electrode 5 being 8 $\mu$m long.

Subsequently, a photoresist film 7 was deposited in a manner to cover a region 6 of low impurity concentration and a part of the gate electrode 5. Using the gate electrode 5 and the photoresist film 7 as a mask, phosphorus was implanted $10^{20}$ cm$^{-3}$ to form a source 2 and a drain 3.

Since the photoresist film 7 covered the gate electrode 5 over a length of 4 $\mu$m, phoshorus was also implanted $10^{20}$ cm$^{-3}$ into the exposed part (4 $\mu$m long) of the gate electrode in this case.

That is, owing to the implantation of phosphorus, a low resistance region 8 containing phosphorus in large quantities and being 4 $\mu$m long and a high resistance region 9 containing no phosphorus and being 4 $\mu$m long were formed in the gate electrode 5 as illustrated in FIG. 2.

The photoresist film 7 was removed, and phosphorus was implanted $2\times10^{12}$ cm$^{-3}$, to form the low impurity concentration region 6.

The process thus far described is the same as the prior-art method of production explained previously. As shown in FIG. 2, the gate electrode 5 has not the impurity distributed entirely but includes the high resistance portion 9.

Figure 3:
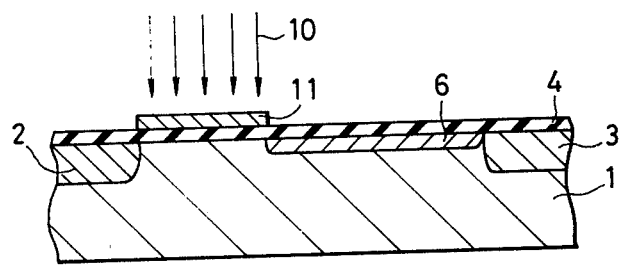
FIGS. 3, 4 and 5 are views showing different embodiments of this invention, respectively.

As illustrated in FIG. 3, therefore, the gate electrode was irradiated with a beam 10 of a Q-switched pulse ruby (wavelength: 0.6943 $\mu$m) or Nd-YAG (second harmonic wave, wavelength: 0.53 $\mu$m) laser at an energy density of 1.5 J/cm$^2$ ten times, the duration of each irradiation being 25 nanoseconds. Thus, the impurity was diffused uniformly over the whole gate electrode, and a gate electrode 11 which was of low resistance entirely was formed.

The switching time of the MIS-FET thus obtained was 20 nanoseconds, and was remarkably improved in comparison with 5 microseconds in the case where the prior-art method was relied on. A noticeable effect of this invention was accordingly recognized.

As apparent from FIG. 3, the laser beam 10 is projected on only the gate electrode 11. Therefore, only the gate electrode is selectively heated, and the other part is not heated.

With this invention, accordingly, only the lateral diffusion of the impurity within the gate electrode can be carried out without exerting any influence on other parts such as the source of the drain. With the prior art method, it was impossible to selectively heat only the gate electrode. Therefore, for the lateral diffusion of the impurity within the gate electrode, there was no other way than heating the whole substrate to a high temperature, and it was inevitable that the parts other than the gate electrode were greatly affected.

This invention has solved such problem, and is very greatly effective for rendering high the switching speed of a high breakdown voltage MIS-FET.

This invention diffuses the impurity in the lateral direction in such a way that the region containing a high concentration of impurity and the desired region adjoining it are fused for a very short time by the irradiation with the laser beam. Therefore, the distance over which the impurity can be diffused is determined by the diffusion coefficient of the impurity and the fusion time owing to the irradiation with the laser beam.

For example, in case of fusing polycrystalline silicon, the diffusion coefficient of phosphorus in the fused polycrystalline silicon is approximately in the order of $10^{-4}$ cm$^2$/sec. Therefore, if the fusion time owing to the laser irradiation is approximately 0.1 microsecond, phosphorus is laterally diffused approximately 0.1 $\mu$m.

In the present embodiment, accordingly, the phosphorus was diffused 4 $\mu$m in the lateral direction so as to put the whole gate electrode into a low resistance in such a way that the gate electrode was irradiated with the beam of the Q-switching pulse ruby laser or Nd-YAG laser at the energy density of 1.5 J/cm$^2$ forty times, the duration of each irradiation being 25 nanoseconds.

Embodiment 2

Figure 4:
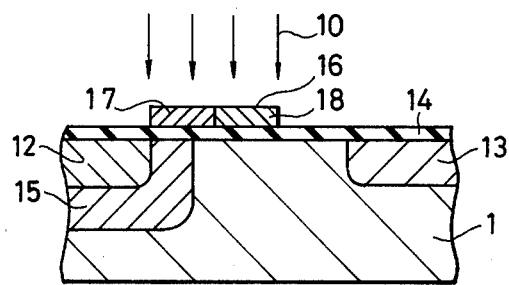

FIG. 4 shows another embodiment of this invention, which is an example wherein an impurity within a gate electrode of a MIS-FET based on the DSA (diffusion self-alignment) system is diffused in the lateral direction by irradiation with a laser beam.

The MIS-FET based on the DSA system is such that after a region 15 opposite in the conductivity type to a source 12 is formed by diffusion, an insulating film 14 and a gate electrode 16 are formed, whereupon the source 12 and a drain 13 are formed by the ion implantation. Also in this case, an end of the gate electrode 16 and an end of the source 12 need to be aligned, and any impurity must not be implanted into the region between the other end of the gate electrode 16 and the drain 13.

To this end, in forming the source 12 and the drain 13, the ion implanation was carried out under the state under which an area from a part of the gate electrode 16 to the end of the portion to form the drain therein was covered with an SiO$_2$ film or the like. As a result, it was unavoidable with the prior-art method of production that a portion of low resistance 17 and a portion of high resistance 18 appeared in the gate electrode 16 as shown in FIG. 4.

However, when only the gate electrode 17, 18 was irradiated with a laser beam 10 as in the case of Embodiment 1, the impurity contained in the low resistance portion 17 diffused in the lateral direction, and a gate electrode which had a uniform low resistance entirely was formed. It was recognized that, as in the case of Embodiment 1, the irradiation was very effective for rendering the switching highly speedy.

Embodiment 3

Figure 5:
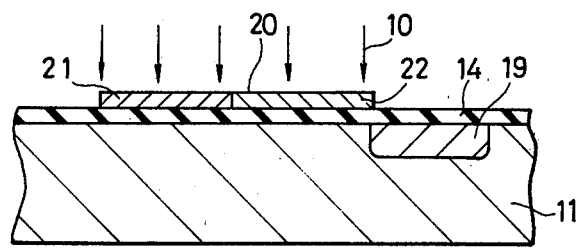

FIG. 5 shows another embodiment of this invention, in which this invention is applied to the formation of a resistor made of: polycrystalline silicon.

Also in this case, likewise to the MIS-FET, when a diffused region of high concentration 19 is disposed in adjacency to an end of a resistor 20, a high resistance region 21 and a low resistance region 22 appear for the reason described in detail in Embodiment 1.

Accordingly, by irradiating only the resistor 20 made of polycrystalline silicon with a laser beam 10, an impurity within the low resistance region 22 diffused in the lateral direction, with the result that the resistance of the polycrystalline silicon film 20 lowered approximately to ½ and that the deviation of resistance values decreased sharply as compared with that in a prior art.

In order to facilitate the description, the above embodiments have indicated the case where the impurity in the polycrystalline silicon film formed on the insulating film is diffused in the lateral direction.

Of course, however, this invention is not restricted to such case. By way of example, it is also possible to diffuse in a plane direction an impurity contained in a surface region of a silicon substrate.

More specifically, an impurity region is formed in the surface region of the semiconductor substrate by a desired process such as ion implantation and thermal diffusion, whereupon the impurity region and a region which adjoins it and into which the impurity is to be diffused are irradiated with a laser beam. Thus, the impurity diffuses into the region irradiated with the laser beam, so that the impurity region can be spread in the desired lateral direction very easily.

Heretofore, the whole substrate has been heated by an electric oven or the like. In this case, therefore, the impurity has diffused also in directions other than the desired direction and it has been impossible to diffuse the impurity in only the desired direction. This invention makes it possible to very easily perform the impurity diffusion in the desired lateral direction having hitherto been impossible, and the merit obtained in the practical use is very great.

What is claimed is:

1. A method of producing a semiconductor device including the step of irradiating with a laser beam both a first region which contains an impurity at a high concentration and a second region which adjoins the first region to diffuse said impurity in a plane direction into said second region, whereby the impurity is more uniformly distributed in the first and second regions to provide a more uniform impurity concentration in the first and second regions.

2. A method of producing a semiconductor device as defined in claim 1, wherein said first region and said second region are formed on an insulating film.

3. A method of producing a semiconductor device as defined in claim 1, wherein said first region and said second region are formed in a surface region of a semiconductor substrate.

4. A method of producing a semiconductor device as defined in claim 1 or 2, wherein said semiconductor device is a metal-insulator-semiconductor field effect transistor or a resistor.

5. A method of producing a semiconductor device as defined in claim 1 or 2 or 3, wherein said first region and said second region are laterally adjacent each other, and said irradiating acts to diffuse said impurity in a lateral direction into said second region.

6. A method of producing a semiconductor device as defined in claim 5, wherein said irradiating with a laser beam fuses said first and second regions.

7. A method of producing a semiconductor device as defined in claim 1 or 2 or 3, wherein said irradiating with a laser beam fuses said first and second regions.

8. A method of producing a semiconductor device as defined in claim 4, wherein said semiconductor device is a metal-insulator-semiconductor field effect transistor, and said first and second regions constitute a gate electrode of said field effect transistor.

9. A method of producing a semiconductor device as defined in claim 8, wherein only said first and second regions are irradiated with the laser beam to diffuse said impurity.

10. A method of producing a semiconductor device as defined in claim 5, wherein only said first and second regions are irradiated with the laser beam to diffuse said impurity.

11. A method of producing a semiconductor device as defined in claim 1 or 2 or 3, wherein only said first and second regions are irradiated with the laser beam to diffuse said impurity.

* * * * *